United States Patent
Komatsu

(10) Patent No.: US 6,380,053 B1
(45) Date of Patent: Apr. 30, 2002

(54) METHOD FOR PRODUCING A SEMICONDUCTOR DEVICE WITH AN ACCURATELY CONTROLLED IMPURITY CONCENTRATION PROFILE IN THE EXTENSION REGIONS

(75) Inventor: Hiroshi Komatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/652,508

(22) Filed: Aug. 31, 2000

(30) Foreign Application Priority Data

Aug. 30, 1999 (JP) ............................. 11-242754

(51) Int. Cl.⁷ .................................. H01L 21/00
(52) U.S. Cl. ...................... 438/517; 438/305
(58) Field of Search .................. 438/305, 303, 438/514, 519, 522, 549, 551, 517

(56) References Cited

U.S. PATENT DOCUMENTS

| | | | | |
|---|---|---|---|---|
| 5,895,955 A | * | 4/1999 | Gardner et al. | 257/336 |
| 6,087,234 A | * | 7/2000 | Wu | 438/299 |
| 6,103,563 A | * | 8/2000 | Lukanc et al. | 438/231 |
| 6,121,100 A | * | 9/2000 | Andideh et al. | 438/305 |
| 6,157,064 A | * | 12/2000 | Huang | 257/346 |
| 6,171,919 B1 | * | 1/2001 | Besser et al. | 438/305 |

FOREIGN PATENT DOCUMENTS

JP 63308382 A * 12/1988 ............... 438/158

* cited by examiner

*Primary Examiner*—Richard Elms
*Assistant Examiner*—Beth E. Owens
(74) *Attorney, Agent, or Firm*—Sonnenschein, Nath & Rosenthal

(57) ABSTRACT

A method for producing a semiconductor device comprising the steps of:
(A) forming a gate insulating layer on a surface of a semi-conductive layer, and then, forming a gate electrode on a gate insulating layer; (B) introducing an impurity in regions of the semi-conductive layer where source/drain regions are to be formed, and then, carrying out heat treatment for activation of the introduced impurity, to form source/drain regions in the semi-conductive layer, and (C) introducing an impurity into at least regions of the semi-conductive layer where extension regions are to be formed, and then, carrying out heat treatment for activation of the introduced impurity, to form extension regions in the semi-conductive layer.

7 Claims, 10 Drawing Sheets

[STEP-100]

[STEP-110]

[STEP-120]

[STEP-130]

[STEP-130] CONTINUED

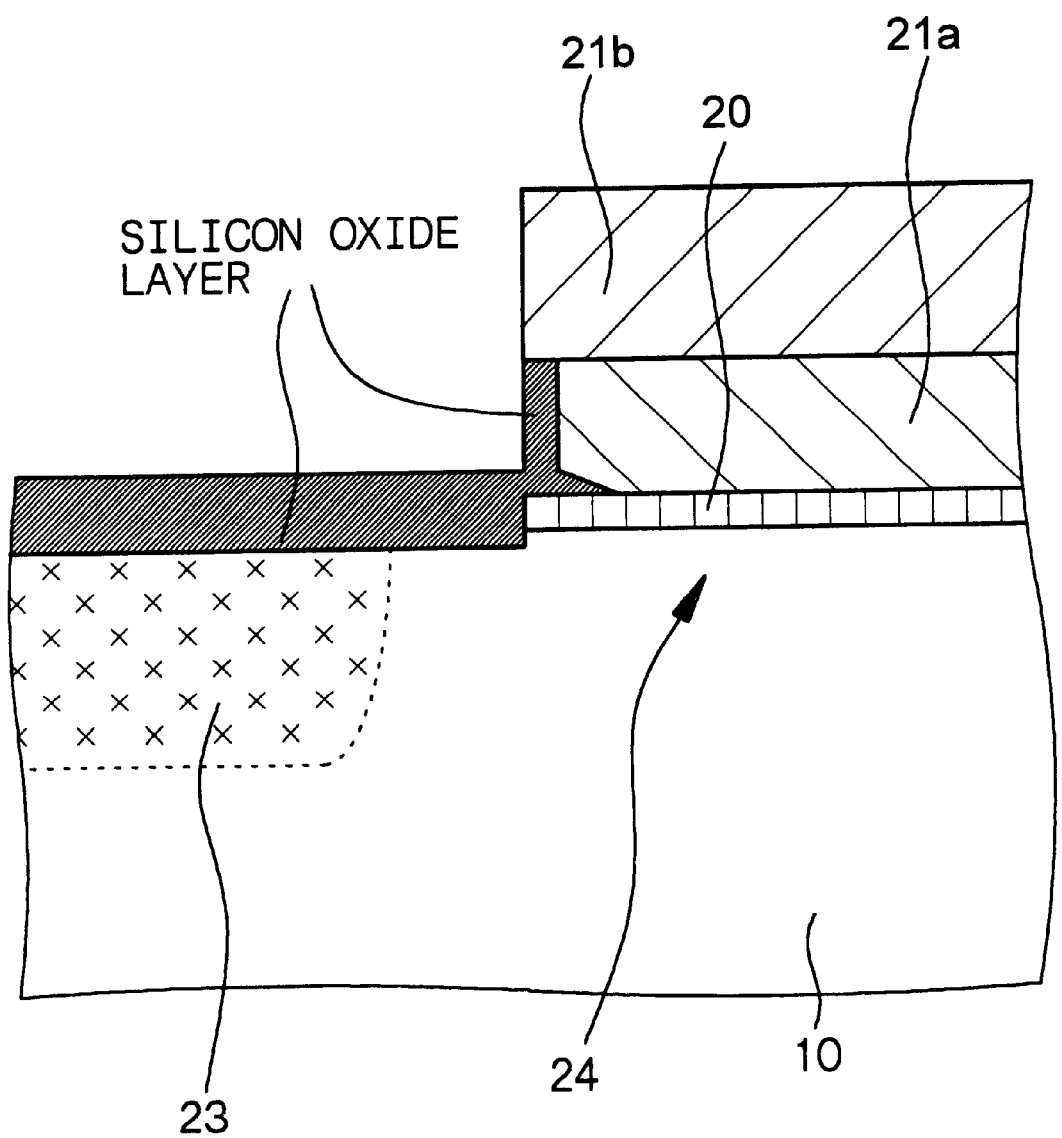

[STEP-210]

[STEP-220]

[STEP-230]

[STEP-310]

[STEP-320]

[STEP-330]

[STEP-330] CONTINUED

[STEP-330] CONTINUED

[STEP-330] CONTINUED

[STEP-20]

[STEP-30]

[STEP-40]

US 6,380,053 B1

METHOD FOR PRODUCING A SEMICONDUCTOR DEVICE WITH AN ACCURATELY CONTROLLED IMPURITY CONCENTRATION PROFILE IN THE EXTENSION REGIONS

BACKGROUND OF THE INVENTION AND RELATED ART STATEMENT

The present invention relates to a method for producing a semiconductor device, particularly to a method for producing a semiconductor device in which an impurity concentration profile of an extension region positioned between a channel forming region and each source/drain region can be controlled accurately.

With increasing shrinkage of semiconductor devices, the integration degree is doubled every three years according to a scaling rule, and speed of semiconductor devices is increasing and power consumption thereof is decreasing. The production of finer MOS type FETs has been being accomplished by decreasing a dimension of a gate electrode, decreasing a thickness of a gate insulating layer and highly accurately controlling an impurity concentration profile in a channel forming region or in its vicinity. And, driving capability of semiconductor devices is improved and a parasitic capacitance thereof is decreased according to finer semiconductor devices. In general, in circuits having a CMOS structure, an operating rate is determined depending upon a rate of charging (or discharging) for giving an output of a logic gate at a certain stage to drive a capacitive load in a subsequent logic gate. Therefore, the operating rate is in proportion to the inverse number of capacity of the capacitive load and to the driving capability.

For accomplishing the formation of finer semiconductor devices, conventionally, there has been employed an LDD (lightly doped drain) structure for forming a source/drain region, i.e., a structure having a low-concentration-impurity-containing region which is formed between each source/drain region and a channel forming region and extends from each source/drain region. In this structure, an electric field near a drain region can be reduced and the change of the semiconductor device caused by hot carriers with elapse of time (an increase in threshold voltage Vth and a decrease in driving capability) can be suppressed. In semiconductor devices finely structured in recent years, however, not only it is required to decrease a supply voltage, but also it is rather required to highly accurately control an impurity concentration profile in an impurity-containing region formed between each source/drain region and a channel forming region than it is required to attain reliability with regard to the hot carriers. For decreasing a parasitic capacitance of the impurity-containing region formed between each source/drain region and the channel-forming region, the impurity-containing region is arranged to have relatively high impurity concentration in many cases in recent years. The impurity-containing region formed between each source/drain region and the channel-forming region will be referred to as "extension region" hereinafter in the present specification. The impurity concentration in the extension region is lower than the impurity concentration in the source/drain region in some cases, equal to the same in some cases, and higher than the same in some cases. That is, the impurity concentration in the extension region is determined depending upon the characteristic required of semiconductor devices.

The method of forming a conventional extension region will be explained with reference to schematic partial cross-sectional views of a semiconductor substrate, etc., shown in FIGS. 9A, 9B and 10 hereinafter.

[Step-10]

A device isolation region 11 having a LOCOS structure is formed, for example, in a semiconductor substrate 10 by a known method, followed by well ion-implanting, channel stop ion-implanting and threshold value adjusting ion-implanting. The device isolation region 11 may have a trench structure, or it may be a combination of a LOCOS structure and a trench structure. Then, the surface of the semiconductor substrate 10 is thermally oxidized to form a gate insulating layer 20. Then, a polysilicon layer 21A and a tungsten silicide layer 21B are formed on the entire surface, and the tungsten silicide layer 21B and the polysilicon layer 21A are patterned by a lighography method and a dry etching method, whereby a gate electrode 21 having a polycide structure can be formed on the gate insulating layer 20.

[Step-20]

For forming an extension region 125, then, the exposed silicon semiconductor substrate 10 is ion-implanted (see FIG. 9A). Then, a first heat treatment for activation is carried out for activating the impurity brought by the ion-implantation and recovering the semiconductor substrate 10 from a crystal defect caused by the ion-implantation. When the above first heat treatment for activation is omitted, the impurity brought by the ion-implantation may be abnormally diffused (enhanced diffusion) at a process temperature around 700° C. applied during formation of a thin layer, for example, by a chemical vapor deposition method (CVD method) in a subsequent step, due to the crystal defect caused in the silicon semiconductor substrate 10 by the ion-implantation, and the impurity concentration profile may vary to a great extent. In the above manner, the extension region 125 can be formed.

[Step-30]

Then an insulating material layer composed, for example, of $SiO_2$ is deposited on the entire surface by a CVD method, and the insulating material layer is etched back, to form gate-side-walls 122 on the side walls of the gate electrode 21 (see FIG. 9B).

[Step-40]

[Step-40]

For forming source/drain regions, then, the exposed silicon semiconductor substrate 10 is ion-implanted (see FIG. 10), and a second heat treatment for activation is carried out for activating the impurity brought by the ion-implantation, whereby source/drain regions 23 and a channel-forming region 24 interposed between the source/drain regions 23 can be formed. The channel-forming region 24 is located immediately below the gate electrode 21. Each extension region 125 is positioned between each source/drain region 23 and the channel-forming region 24 and extends from each source/drain region 23.

In the method of forming the above conventional extension region, the thermal budget (effective heat treatment quantity) in the extension region is always higher than the thermal budget in the source/drain region for the following reason. The sourcejdrain region is subjected to the heat treatment for activation once, but the extension region is subjected to the heat treatment for activation twice.

For improving the impurity concentration profile in the extension region to make it higher than the impurity concentration profile in the source/drain region, it is required to decrease the impurity concentration in the extension region. When the impurity concentration in the extension region is decreased, however, there is caused the following problem.

The resistance of the extension region increases, a parasitic resistance in the semiconductor device increases, and as a result, the driving capability decreases. The parasitic resistance in the extension region and the control of the impurity concentration profile in the extension region have a trade-off relationship, which comes to represent a great difficulty. Further, if the impurity concentration in the extension region is not increased, the driving capability decreases due to an increase in the parasitic resistance. If the impurity concentration is increased to excess, it is difficult to produce a finer-structured semiconductor device with suppressing a short channel effect.

The broadening of the impurity concentration profile in the extension region in a lateral direction particularly increases an overlap capacitance between the marginal portion of the gate electrode and the source/drain region and decreases the operating rate of the semiconductor device to a great extent.

Under the circumstances, the optimization of the impurity concentration and the accurate controlling of the impurity concentration profile in the extension region are increasingly acquiring importance in the production of finer-structured semiconductor devices.

OBJECT AND SUMMARY OF THE INVENTION

It is therefore an object of the present invention to provide a method for producing a semiconductor device, in which impurity concentration in an extension region positioned between a channel-forming region and each source/drain region can be optimized and an impurity concentration profile in the extension region can be controlled highly accurately.

According to the present invention, the above object of the present invention is achieved by a method for producing a semiconductor device having:

(a) a gate insulating layer formed on a surface of a semi-conductive layer, and a gate electrode formed on the gate insulating layer, (b) a channel-forming region formed in the semi-conductive layer immediately below the gate electrode, (c) source/drain regions formed in the semi-conductive layer, so as to sandwich the channel-forming region, and (d) extension regions, each of which is formed in a region of the semi-conductive layer positioned between each source/drain region and the channel-forming region and extends from each source/drain region, said method comprising the steps of:

(A) forming the gate insulating layer on the surface of the semi-conductive layer, and then, forming the gate electrode on the gate insulating layer, (B) introducing an impurity in regions of the semi-conductive layer where the source/drain regions are to be formed, and then, carrying out heat treatment for activation of the introduced impurity, to form the source/drain regions in the semi-conductive layer, and (C) introducing an impurity into at least regions of the semi-conductive layer where the extension regions are to be formed, and then, carrying out heat treatment for activation of the introduced impurity, to form the extension regions in the semi-conductive layer.

In a conventional method for producing a semiconductor device, the source/drain regions are formed after the extension regions are formed. Therefore, the extension regions are twice heat-treated for activation. In the method for producing a semiconductor device, provided by the present invention, the extension regions are formed after the source/drain regions are formed. Therefore, the number of times of the heat treatment for activation to which each extension region is subjected is smaller than the number of times of the heat treatment for activation to which each source/drain region is subjected. As a result, the impurity concentration profile in the extension region can be highly accurately maintained.

The impurity concentration in the extension region is lower than the impurity concentration in the source/drain region in some cases, is equal to the same in some cases, or is higher than the same in some cases. Essentially, the impurity concentration in the extension region can be determined depending upon the characteristic that the semiconductor device is required to have. The junction depth of the extension region (depth from the surface of the semi-conductive layer to the bottom of the extension region) is required to be smaller than the junction depth of the source/drain region (depth from the surface of the semi-conductive layer to the bottom of the source/drain region).

The gate electrode can be formed of at least a polysilicon layer. That is, the gate electrode may be formed of one polysilicon layer, it may have a two-layered structure formed of a polysilicon layer and a silicide layer (polycide layer), or it may have a two-layered structure formed of a polysilicon layer and a metal layer such as a tungsten layer. In these case, the step (C) preferably includes the step of oxidizing side walls of the polysilicon layer constituting the gate electrode. The thickness of the gate insulating layer in the vicinity of the side walls of the gate electrode can be increased by oxidizing the side walls of the polysilicon layer, and as a result, an overlap capacitance between the marginal portion of the gate electrode and the source/drain region can be decreased.

In the step (C) of the method for producing a semiconductor device, provided by the present invention, after the impurity is introduced into at least the regions of the semi-conductive layer where the extension regions are to be formed, the heat treatment for activation of the introduced impurity may be carried out once only, or may be carried out a plurality of times (at least twice). That is, in the former case, the formation of the extension region is carried out once. In the latter case, the formation of the extension region is carried out a plurality of times (at least twice) from a source/drain region side. In a portion of each extension region closer to the channel-forming region, it is required to control the impurity concentration profile more highly accurately. When the formation of the extension region is carried out a plurality of times, the impurity concentration profile in the extension region can be adjusted or controlled to a more desirable and more highly accurate impurity concentration profile.

When the formation of the extension region is carried out once, there may be employed an embodiment of the method for producing a semiconductor device, provided by the present invention, in which;

between the steps (A) and (B), sidewalls are formed on the side walls of the gate electrode, in the step (B), the impurity is introduced into the regions of the semi-conductive layer where the source/drain regions are to be formed and the heat treatment for activation of the introduced impurity is carried out, and in the step (C), the sidewalls are removed, the impurity is introduced into the source/drain regions and the regions of the semi-conductive layer where the extension regions are to be formed and the heat treatment for activation of the introduced impurity is carried out.

By forming the sidewalls as described above, the source/drain regions and the extension regions can be formed in a self-aligned manner. The sidewalls can be composed, for example, of $SiO_2$, SiN, a two-layered structure of $SiO_2$/SiN or a polysilicon.

Alternatively, when the formation of the extension region is carried out a plurality of times, there may be employed an embodiment of the method for producing a semiconductor device, provided by the present invention, in which:

between the steps (A) and (B), sidewalls having a multi-layered structure are formed on the side walls of the gate electrode, in the step (B), the impurity is introduced into the regions of the semi-conductive layer where the source/drain regions are to be formed and the heat treatment for activation of the introduced impurity is carried out, and in the step (C), of each sidewall having a multi-layered structure, each sidewall unit, constituting each sidewall having a multi-layered structure, positioned on the outer side is removed, the impurity is introduced into the source/drain regions and the regions of the semi-conductive layer where the extension regions are to be formed, then, the heat treatment for activation of the introduced impurity is carried out, and the removal of such a sidewall unit, the introduction of the impurity and the heat treatment for activation are repeated until the sidewall units constituting the sidewall having a multi-layered structure are all removed.

By forming the sidewall having a multi-layered structure, the formation of the source/drain regions and the formation of the extension regions carried out a plurality of times can be carried out in a self-aligned manner. Each sidewall unit constituting the sidewall having a multi-layered structure can be composed, for example, of $SiO_2$, SiN and a polysilicon, and it is preferred to use a combination of these materials that can allow an etching selectivity.

For decreasing the resistance in the source/drain regions, preferably, gate-side-walls are formed on the side walls of the gate electrode so as to cover at least the extension regions after the step (C), and then, the source/drain regions are converted to silicide source/drain regions. In the conversion to the silicide source/drain regions, surface regions of the source/drain regions may be composed of silicide, or the source/drain regions as a whole in the thickness direction may be composed of silicide depending upon the semiconductor device structures. For the conversion into the silicide source/drain regions, for example, a metal layer is formed on the entire surface, and heat treatment is carried out to react atoms constituting the metal layer with atoms (for example, Si) constituting the semi-conductive layer, whereby a silicide layer is formed. Then, an unreacted portion of the metal layer is removed, and heat treatment is carried out again, whereby a stabilized silicide layer can be obtained. The metal for the metal layer includes cobalt (Co), nickel (Ni), platinum (Pt), titanium (Ti), Ta (tantalum), Mo (molybdenum), tungsten (W) and palladium (Pd). The width of the gate-side-wall on the surface of the semi-conductive layer is required to be equal to, or greater than, the width of the extension region. That is, it is required to fully cover the extension region with the gate-side-wall, and the gate-side-wall may extend up to part of the source/drain region.

The semi-conductive layer may be formed of a silicon semiconductor substrate per se, or it may be formed of a so-called SOI (Semiconductor-On-Insulator) layer formed on an insulation layer formed on a support. When the semi-conductive layer is formed of a silicon semiconductor substrate per se, a semiconductor device is a so-called bulk semiconductor device, and when it is formed of an SOI layer, a semiconductor device is a so-called SOI type semiconductor device. The semi-conductive layer may be made of Si, or it may be made of a compound crystal of Si—Ge.

The method of forming the SOI layer includes the following methods (1) to (5).

(1) A substrate bonding method, in which a semiconductor substrate and a supporting substrate are bonded through an insulation layer, and the semiconductor substrate is ground and polished from its back surface, to obtain a support made of the supporting substrate, the insulation layer and the semi-conductive layer made of the ground and polished semiconductor substrate.

(2) A smart-cut method, in which an insulation layer is formed on a semiconductor substrate, the semiconductor substrate is implanted with hydrogen ion to form a peel-off layer inside the semiconductor substrate, the semiconductor substrate and a supporting substrate are bonded through the insulation layer, the resultant product is heat-treated to peel off (cleave) the semiconductor substrate from the peel-off layer, and the remaining semiconductor substrate is ground and polished from its back surface, to obtain a support made of the supporting substrate, the insulation layer and the semi-conductive layer made of the ground and polished semiconductor substrate.

(3) An SIMOX (Separation by IMplanted OXygen) methods in which oxygen ion is implanted into a semiconductor substrate, and then, the semiconductor substrate is heat-treated to form an insulation layer inside the semiconductor substrate, whereby a support made of part of the semiconductor substrate is formed below the insulation layer and a semi-conductive layer made of part of the semiconductor substrate is formed above the insulation layer.

(4) A method in which a single crystal semi-conductive layer is formed on an insulation layer formed on a semiconductor substrate corresponding to a support, in a gaseous phase or a solid phase, to obtain a support formed of the semiconductor substrate, the insulation layer and the semi-conductive layer formed of the single crystal semi-conductive layer.

(5) A method in which an insulation layer is formed by partially converting a surface of a semiconductor substrate into a porous surface by anodic oxidation, to form a support made of part of the semiconductor substrate below an insulation layer and a semi-conductive layer made of part of the semiconductor substrate above the insulation layer.

The method for producing a semiconductor device, provided by the present invention, is effective particularly when it is applied to the production of a semiconductor device in which the junction depth of the source/drain region is determined by a physical parameter such as the thickness of the SOI layer, that is, an SOI type semiconductor device. On the production of the SOI type semiconductor device, when the heat treatment for activation is carried out, a change in the impurity concentration profile in a lateral direction increases as a change in the impurity concentration profile in the thickness direction is small. However, the impurity concentration profile in the lateral direction can be accurately controlled by applying the method for producing a semiconductor device, provided by the present invention.

The gate insulating layer can be formed, for example, by a thermal oxidation method or a combination of a thermal oxidation method with a thermal nitriding method, and it can be composed, for example of $SiO_2$ or $SiO_2$/SiN.

BRIEF DESCRIPTION OF THE DRAWINGS

The present invention will be explained with reference to Examples hereinafter.

FIG. 1B, are schematic partial cross-sectional views of the silicon semiconductor substrate, etc., for explaining the method for producing the semiconductor device in Example 1.

FIG. 3 is an enlarged view of part of the silicon semiconductor substrate, etc., for explaining the method for producing the semiconductor device in Example 1.

FIG. 5B, are schematic partial cross-sectional views of the silicon semiconductor substrate, etc., for explaining the method for producing the semiconductor device in Example 3.

FIG. 6B, are schematic partial cross-sectional views of the silicon semiconductor substrate, etc., for explaining the method for producing the semiconductor device in Example 3.

FIG. 9B, is a schematic partial cross-sectional view of the semiconductor substrate, etc., for outlining the conventional method of forming the extension region.

DESCRIPTION OF THE PREFERRED EMBODIMENTS

Example 1

Figure 1A:
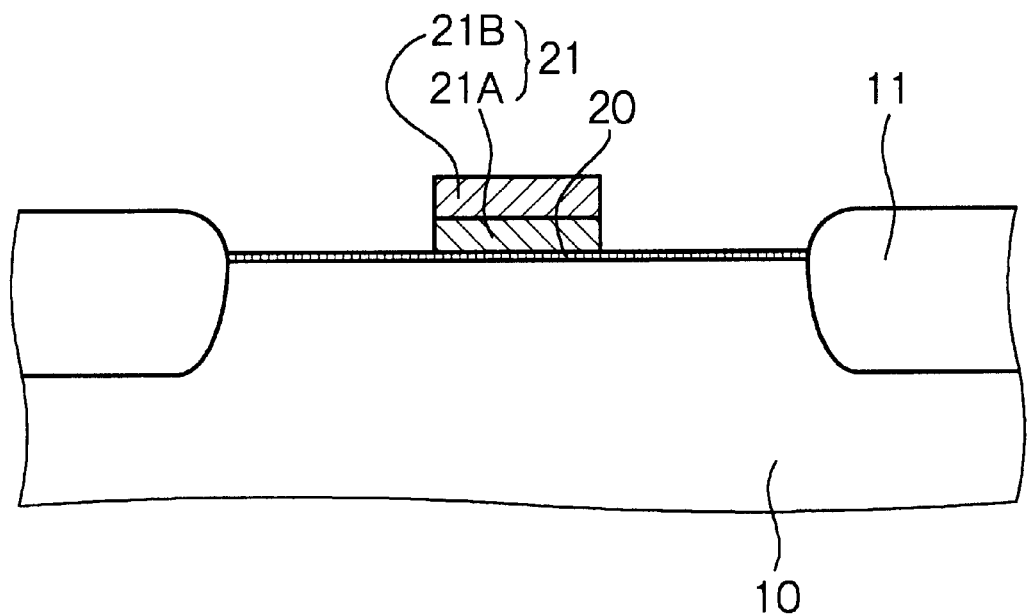
FIGS. 1A and 1B are schematic partial cross-sectional views of a silicon semiconductor substrate, etc., for explaining a method for producing a semiconductor device in Example 1.

In Example 1, a semi-conductive layer is formed of a silicon semiconductor substrate per se. Extension regions are formed by one step. The method for producing a semiconductor device in Example 1 will be explained with reference to FIGS. 1A, 1B, 2A, 2B and 2C showing schematic partial cross-sectional views of a silicon semiconductor substrate, etc.

[Step-100]

First, a gate insulating layer is formed on the surface of a silicon semiconductor substrate 10 corresponding to a semi-conductive layer, and then, a gate electrode is formed on the gate insulating layer. Specifically, first, a device isolation region 11 having a LOCOS structure is formed on the silicon semiconductor substrate 10 by a known method, followed by well ion-implanting, channel stop ion-implanting and threshold value adjusting ion-implanting. The device isolation region 11 may have a trench structure, or it may have a combination of a LOCOS structure with a trench structure. Then, the surface of the silicon semiconductor substrate 10 is thermally oxidized to form the gate insulating layer 20. Then, for example, a 70 nm thick polysilicon layer 21A and a 70 nm thick tungsten silicide layer 21B are formed on the entire surface by known CVD methods. The tungsten silicide layer 21B and the polysilicon layer 21A are patterned by a lithography method and a dry etching method, whereby the gate electrode 21 having a polycide structure can be formed on the gate electrode 20 (see FIG. 1A).

An offset oxide layer may be formed on the gate electrode 21. That is, a polysilicon layer, a tungsten silicide layer and a silicon oxide layer are formed on the entire surface by known CVD methods, and then, the silicon oxide layer, the tungsten silicide layer and the polysilicon layer are patterned by a lithography method and a dry etching method, to form the gate electrode 21 on the gate insulating layer 20. The offset oxide layer can prevent the injection of an impurity into the gate electrode when ion-implantation is carried out during the formation of the source/drain region.

[Step-110]

Figure 1B:
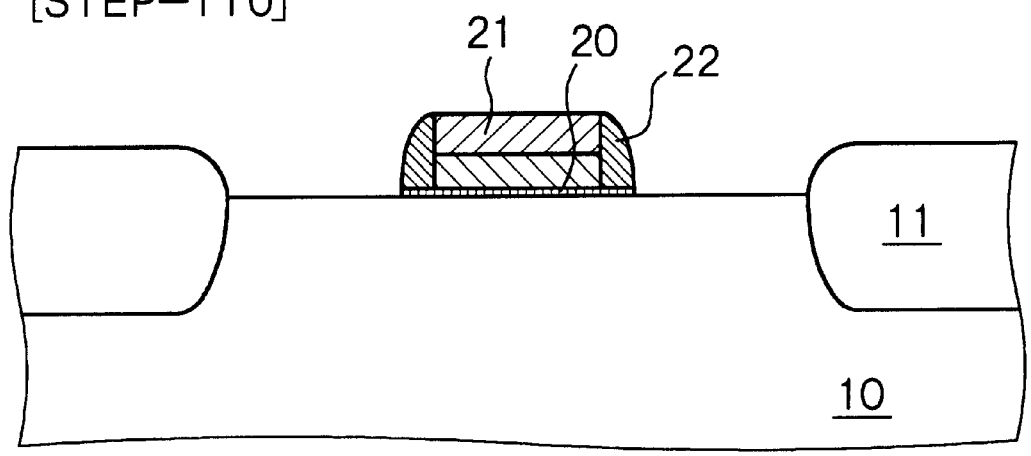
Figure 2A:
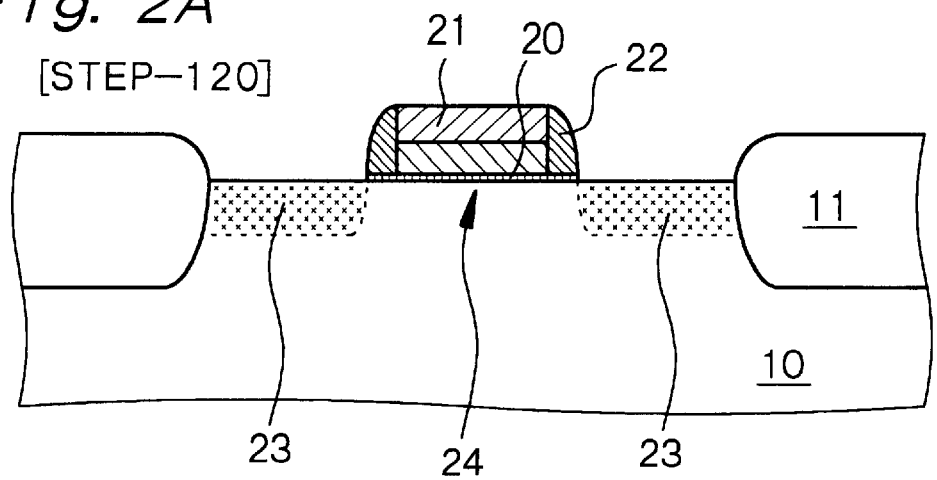
FIGS. 2A, 2B and 2C, following
Figure 2B:
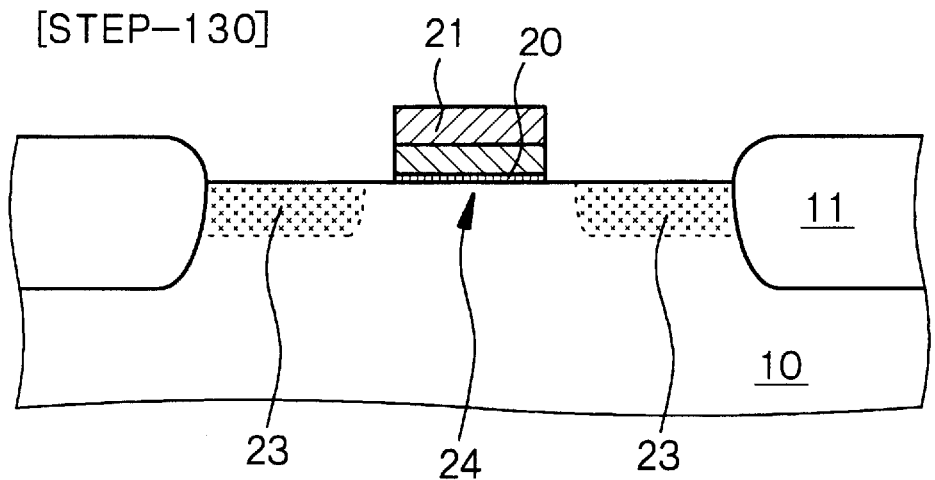
Figure 2C:
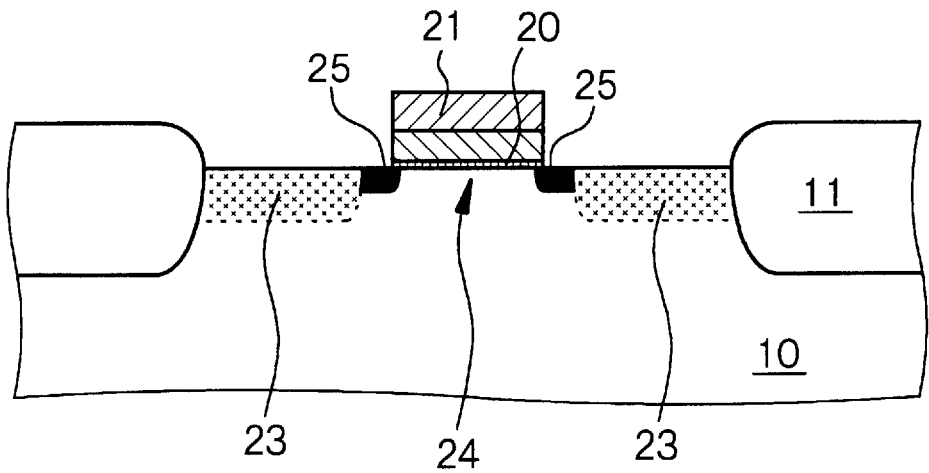

Then, sidewalls 22 are formed on the side walls of the gate electrode 21 (see FIG. 1B). Specifically, an $SiO_2$ layer is deposited on the entire surface by a CVD method under a condition shown in Table 1, and the $SiO_2$ layer is etched back under a condition shown in Table 2.

TABLE 1

| Gas | $SiH_4/O_2/N_2$ = 30/540/23000 sccm |
|---|---|
| Pressure | Atmospheric pressure |
| Substrate temperature | 430° C. |

TABLE 2

| Gas | $CHF_3/CF_4/Ar$ = 30/50/800 sccm |
|---|---|
| RF power | 500 W |
| Pressure | 240 Pa |
| Substrate temperature | 0° C. |

[Step-120]

A channel-forming region 24 is formed in the semi-conductive layer (corresponding to the silicon semiconductor substrate 10). Then, an impurity is introduced into regions of the silicon semiconductor substrate 10 where source/drain regions are to be formed, and the introduced impurity is heat-treated for activation, to form source/drain regions 23 in the silicon semiconductor substrate 10. For example, when CMOS is produced, a region of the semiconductor substrate 10 where p-channel type semiconductor device is to be formed is covered with a resist material (not shown), and the silicon semiconductor substrate 10 is ion-implanted with arsenic (As) which is an n-type impurity (see FIG. 2A). Then, the resist material is removed, a region of the silicon semiconductor substrate 10 where an n-channel type semiconductor device is to be formed is covered with a resist material (not shown), and the silicon semiconductor substrate I/O is ion-implanted with boron (B) which is a p-type impurity. Table 3 shows ion-implanting conditions. Then, the introduced impurities are heat-treated for activation by an RTA (Rapid Thermal Annealing) method. Table 4 shows a condition of the heat treatment for activation.

TABLE 3 n-Channel type semiconductor device

| | |
|---|---|
| Ion species | As$^+$ |
| Acceleration energy | 50 keV |
| Dose | 3 × 10$^{15}$/cm$^2$ | p-Channel type semiconductor device

| | |
|---|---|
| Ion species | BF$_2^+$ |
| Acceleration energy | 20 keV |
| Dose | 3 × 10$^{15}$/cm$^2$ |

TABLE 4

| | |
|---|---|
| Treatment temperature | 1000° C. |
| Treatment time period | 10 seconds |
| Treatment atmosphere | N$_2$ gas atmosphere |

[Step-130]

Then, an impurity is introduced into at least regions of the semi-conductive layer where extension regions are to be formed, and then, the introduced impurity is heat-treated for activation, to form extension regions 25 in the semi-conductive layer. Specifically, the sidewalls 22 are immersed in a hydrofluoric-acid-containing aqueous solution, to remove the sidewalls 22 (see FIG. 2B). For preventing channeling, then, an approximately 4 nm thick silicon oxide layer (shown only in an enlarged view of FIG. 3) is preferably formed on the surface of the silicon semiconductor 10 by a dry oxidation method. In this case, side walls of the polysilicon layer 21A constituting the gate electrode 21 are oxidized at the same time. The enlarged view of FIG. 3 alone shows a state where the side walls of the polysilicon layer 21A are oxidized. As described above, the thickness of the gate insulating layer 20 in the vicinity of the side walls of the gate electrode 21 can be increased, and as a result, an overlap capacitance between the marginal portion of the gate electrode 21 and the source/drain region 23 can be decreased.

Then, an impurity is introduced into at least regions of the semi-conductive layer where extension regions are to be formed (the source/drain regions 23 and the regions of the semi-conductive layer where the extension regions 25 are to be formed in Example 1) by an ion-implanting method. For producing CMOS for example, a resist material (not shown) is formed on a region of the silicon semiconductor substrate 10 where a p-channel type semiconductor device is to be formed, and the silicon semiconductor substrate 10 is ion-implanted with arsenic (As) which is an n-type impurity (see FIG. 2C). Then, the resist material is removed, a resist material (not shown) is formed on a region of the silicon semiconductor substrate 10 where an n-channel type semiconductor device is to be formed, and the silicon semiconductor substrate 10 is ion-implanted with boron (B) which is a p-type impurity. Table 5 shows ion-implanting conditions. Then, the introduced impurities are heat-treated for activation by an RTA method. Table 6 shows a condition of the heat treatment for activation.

TABLE 5 n-Channel type semiconductor device

| | |
|---|---|
| Ion species | As$^+$ |
| Acceleration energy | 5 keV |
| Dose | 6 × 10$^{14}$/cm$^2$ |

TABLE 5-continued p-Channel type semiconductor device

| | |
|---|---|
| Ion species | BF$_2^+$ |
| Acceleration energy | 5 keV |
| Dose | 2 × 10$^{14}$/cm$^2$ |

TABLE 6

| | |
|---|---|
| Treatment temperature | 950° C. |
| Treatment time period | 10 seconds |
| Treatment atmosphere | N$_2$ gas atmosphere |

[Step-140]

Then, an insulating interlayer is formed on the entire surface by a known method, an opening portion is formed in the insulating interlayer above the source/drain region 23, a wiring material layer is formed in the opening portion and on the insulating interlayer, and then, the wiring material layer is patterned to form a wiring, whereby a semiconductor device is completed.

The above semiconductor device comprises the gate insulating layer 20 formed on the surface of the semi-conductive layer (silicon semiconductor substrate 10 in Example 1); the gate electrode 21 formed on the gate insulating layer 20; the channel-forming region 24 formed in the semi-conductive layer (corresponding to the silicon semiconductor substrate 10 in Example 1) immediately below the gate electrode 21; the source/drain regions 23 formed in the semi-conductive layer (corresponding to the silicon semiconductor substrate 10 in Example 1), so as to sandwich the channel-forming region 24; and the extension regions 25 each of which is formed in the region of the semi-conductive layer (corresponding the silicon semiconductor substrate 10 in Example 1) positioned between each source/drain region 23 and the channel-forming region 24 and extends from each source/drain region 23. Each source/drain region 23 has an impurity concentration of approximately 3×10$^{20}$/cm$^3$, and each extension region has an impurity concentration of approximately 1×10$^{20}$/cm$^3$ when the semiconductor device is an n-channel MOS type semiconductor device or an impurity concentration of approximately 3×10$^{19}$/cm$^3$ when the semiconductor device is a p-channel MOS type semiconductor device. In the semiconductor device produced in Example 1, no sidewall is present on the side wall of the gate electrode, so that a fringing capacitance between the marginal portion of the gate electrode and the source/drain region 23 can be decreased.

Example 2

Example 2 is a variant of Example 1. In Example 2, between [Step-130] and [Step-140], gate-side-walls 30 are formed on the side walls of the gate electrode 21 such that at least the extension regions 25 are covered, and then, the surfaces of the source/drain regions 23 are converted to silicide surfaces. Mainly with regard to differences from Example 1, the method for producing a semiconductor device in Example 2 will be explained with reference to FIG. 4.

[Step-200]

A gate insulating layer 20 is formed on a surface of a silicon semiconductor substrate 10 corresponding to a semi-conductive layer, and a gate electrode 21 is formed on the gate insulating layer 20, in the same manner as in [Step-100] of Example 1. Unlike Example 1, the gate electrode 21 is formed of a polysilicon layer alone in Example 2.

[Step-210]

Figure 4A:
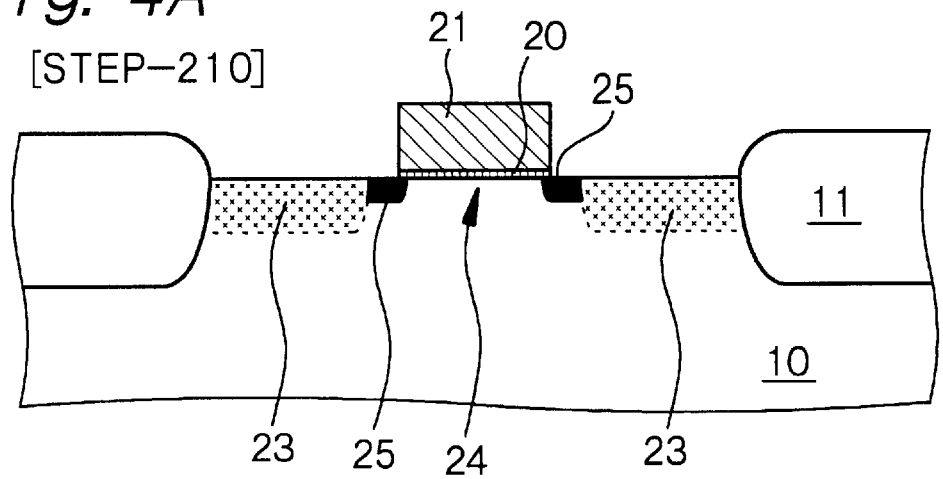
FIGS. 4A, 4B and 4C are schematic partial cross-sectional views of a silicon semiconductor substrate, etc., for explaining a method for producing a semiconductor device in Example 2.

Then, [Step-110], [Step-120] and [Step-130] in Example 1 are carried out, whereby a structure shown in FIG. 4A can be obtained.

[Step-220]

Figure 4B:
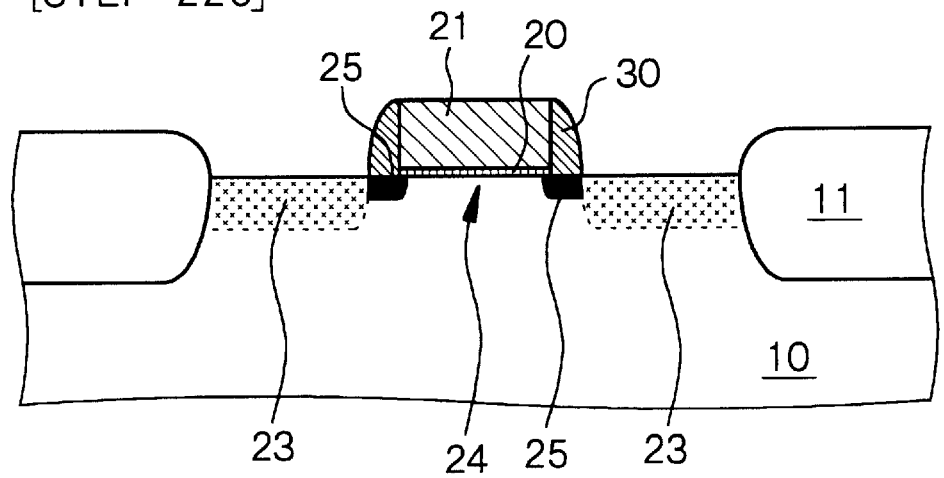

Then, gate-side-walls 30 are formed on the side walls of the gate electrode 21 so as to cover the extension regions 25 (see FIG. 4B). Specifically, an $SiO_2$ layer is deposited on the entire surface by a CVD method under the condition shown in Table 1, and then, the $SiO_2$ layer is etched back under the condition shown in Table 2.

[Step-230]

Figure 4C:
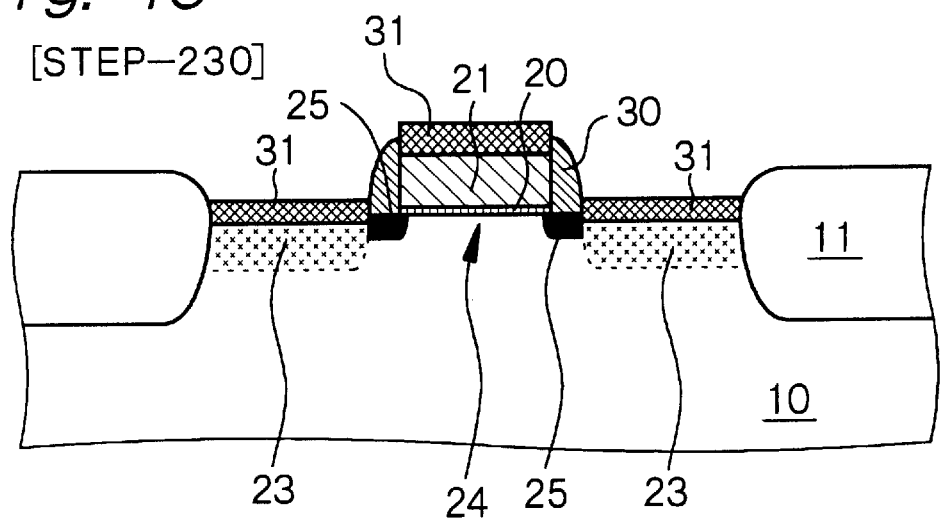

Then, a cobalt silicide ($COSi_2$) layer 31 is formed on the surfaces of the source/drain regions 23 (see FIG. 4C). Specifically, a cobalt layer is deposited on the entire surface by a sputtering method under a condition shown in Table 7. Then, heat treatment is carried out by an RTA method under a condition shown in Table 8, to react silicon atoms of the semi-conductive layer (specifically, the silicon semiconductor substrate 10) constituting the source/drain regions 23 with cobalt atoms, whereby the cobalt silicide layer 31 is formed on the surfaces of the source/drain regions 23. In the formation of the silicide, cobalt atoms mainly migrate into the silicon semiconductor substrate 10. The cobalt silicide layer 31 is also formed on the top surface of the gate electrode 21 composed of polysilicon. A cobalt layer on the gate-side-walls 30 and the device isolation region 11 remains unreacted. Then, the unreacted cobalt layer is removed in a mixture solution containing sulfuric acid, hydrogen peroxide and pure water, and heat treatment is again carried out by an RTA method under a condition shown in Table 9, to decrease the resistance of the cobalt silicide layer 31.

TABLE 7

| | |
|---|---|
| Target | Cobalt (CO) |
| Process gas | Ar = 100 sccm |
| Pressure | 0.4 Pa |
| DC power | 0.8 kW |
| Temperature for heating substrate | 450° C. |

TABLE 8

| | |
|---|---|
| Atmosphere | 100% $N_2$ atmosphere or $N_2$/Ar atmosphere |
| Pressure | Atmospheric pressure |
| Temperature for heating substrate | 550° C. |
| Heating time period | 30 seconds |

TABLE 9

| | |
|---|---|
| Atmosphere | 100% $N_2$ atmosphere or $N_2$/Ar atmosphere |
| Pressure | Atmospheric pressure |
| Temperature for heating substrate | 700° C. |
| Heating time period | 30 seconds |

[Step-240]

Then, [Step-140] in Example 1 is carried out, to complete a semiconductor device.

Example 3

Example 3 is also a variant of Example 1. Example 3 differs from Example 1 in that the formation of extension regions is carried out from a source/drain region side a plurality of times. The method for producing a semiconductor device in Example 3 will be explained with reference to schematic partial cross-sectional views of a silicon semiconductor substrate, etc., shown in FIGS. 5A, 5B, 6A, 6B, 7A and 7B.

[step-300]

A gate insulating layer 20 is formed on a surface of a silicon semiconductor substrate 10 corresponding to a semi-conductive layer, and a gate electrode 21 is formed on the gate insulating layer 20, in the same manner as in [Step-100] of Example 1.

[Step-310]

Then, sidewalls having a multi-layered structure are formed on side walls of the gate electrode 21. For this purpose, first, an approximately 10 nm thick $SiO_2$ layer (not shown) is deposited on the entire surface by a TEOS-CVD method. Then, a 50 nm thick polysilicon layer is deposited on the entire surface by a CVD condition shown in Table 10. The polysilicon layer is then etched back under a condition shown in Table 11, to form first sidewall units 22A. Then, a 50 nm thick $SiO_2$ layer is deposited on the entire surface by the CVD condition shown in Table 1, and then, etched back under the condition shown in Table 2, to form second sidewall units 22B, whereby a structure shown in FIG. 5A can be obtained. There may be employed a constitution in which $SiO_2$ is used as a material for forming the first sidewall units 22A and polysilicon is used as a material for forming the second sidewall units 22B. The point is that materials are combined such that a sufficient etching selectivity ratio can be secured between a material for forming the first sidewall units 22A and a material for forming the second sidewall units 22B.

TABLE 10

| | |
|---|---|
| Gas | $SiH_4/N_2$ = 300/2000 sccm |
| Pressure | 60 Pa |
| Substrate temperature | 610° C. |

TABLE 11

| | |
|---|---|
| Gas | $Cl_2$/HBr = 40/100 sccm |
| RF power | 70 W |
| Pressure | 1 Pa |
| Substrate temperature | 0° C. |

[Step-320]

Figure 5A:
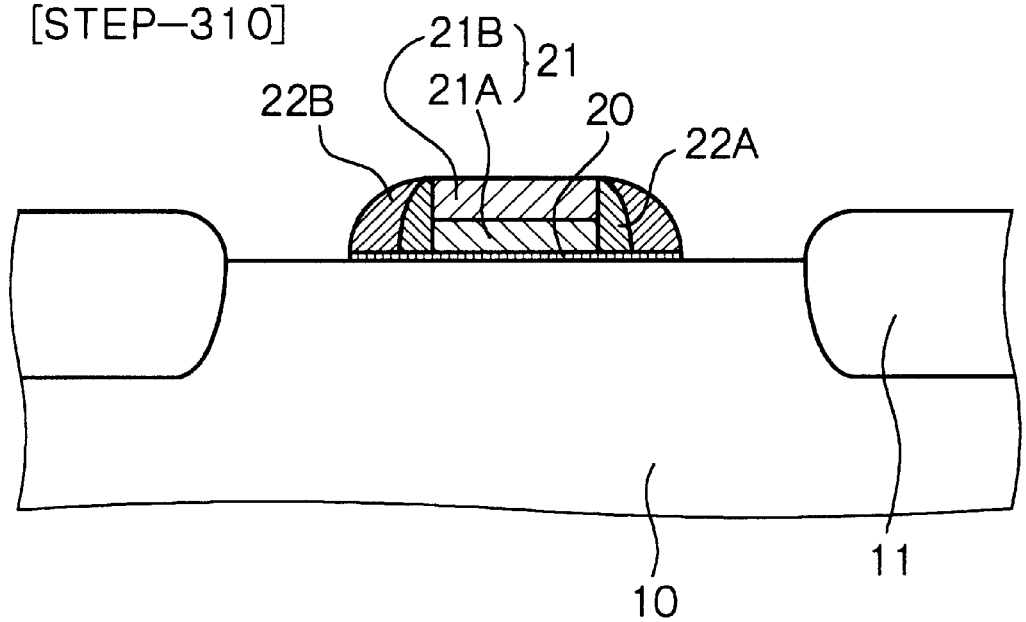
FIGS. 5A and 5B are schematic partial cross-sectional views of a silicon semiconductor substrate, etc., for explaining a method for producing a semiconductor device in Example 3.
Figure 5B:
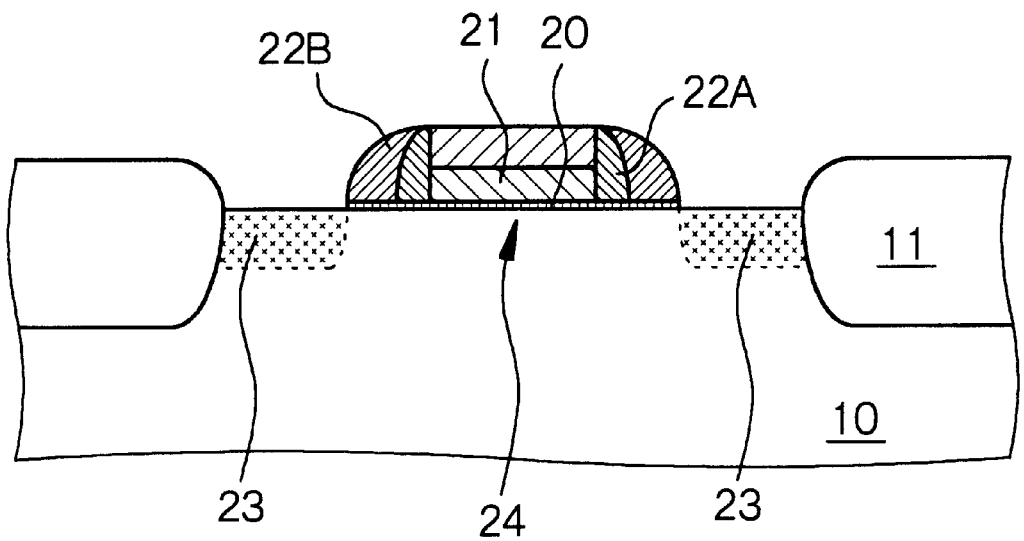

Then, an impurity is introduced into regions of the silicon semiconductor substrate 10 where source/drain regions are to be formed, in the same manner as in [Step-120] in Example 1, and the introduced impurity is heat-treated for activation, to form source/drain regions 23 in the silicon semiconductor substrate 10 (see FIG. 5B).

[Step-330]

Then, of each sidewall having a multi-layered structure, each sidewall unit positioned outside is removed, an impurity is introduced into the source/drain regions and regions of the semi-conductive layer where extension regions are to be formed, and the introduced impurity is heat-treated for activation. The removal of the sidewall units, the introduction of an impurity and the heat treatment for activation are repeated until the sidewall units constituting the sidewall having a multi-layered structure are all removed.

Figure 6A:
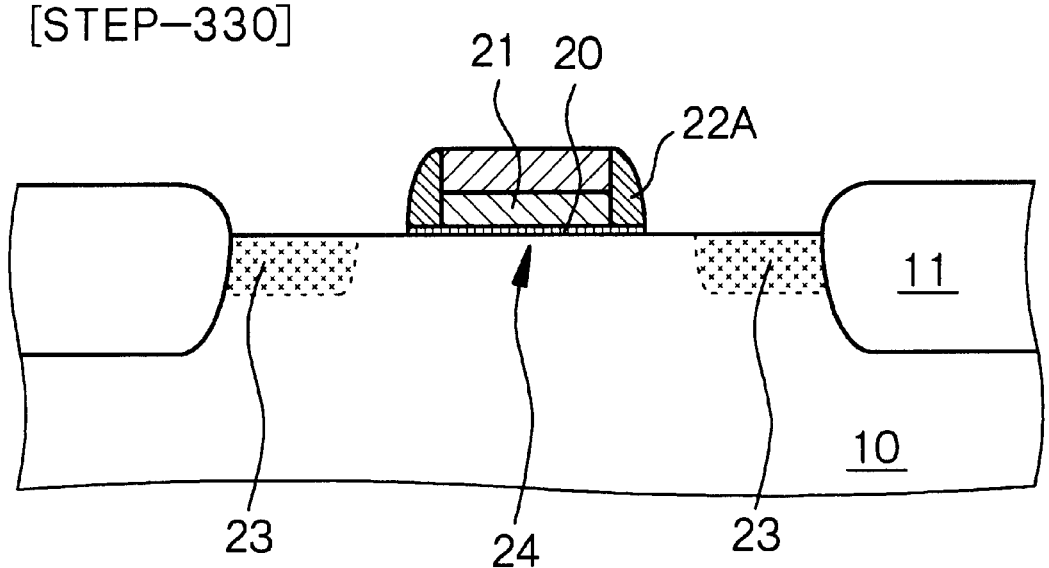
FIGS. 6A and 6B, following
Figure 6B:
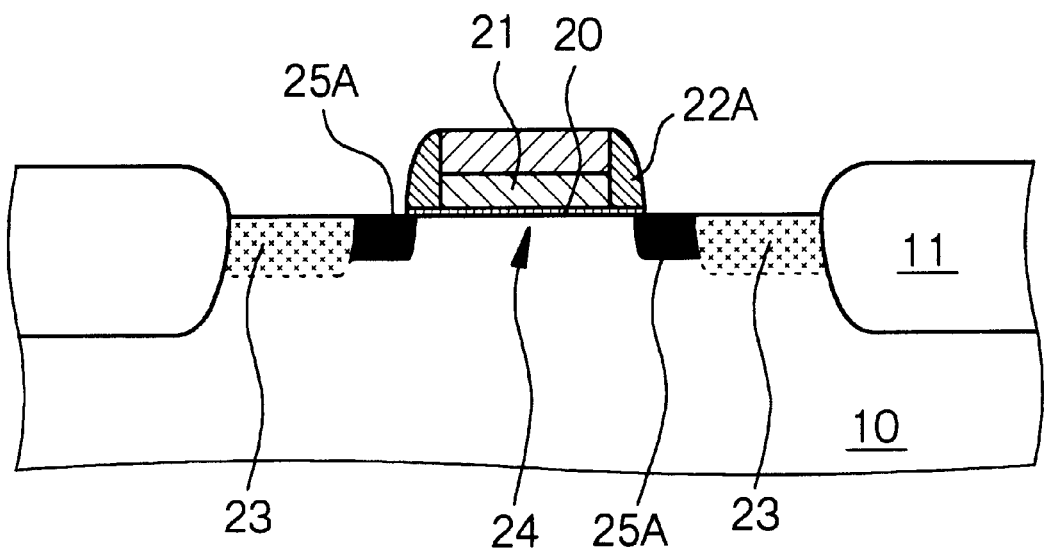

Specifically, the second sidewall units 22B composed of $SiO_2$ are immersed in a hydrofluoric-acid-containing aqueous solution, to remove the second sidewall units 22B (see FIG. 6A). Then, for preventing channeling, preferably, an approximately 4 nm thick silicon oxide layer (not shown) is formed on the surface of the silicon semiconductor substrate 10 by a dry oxidation method. And, an impurity is introduced into at least regions of the semi-conductive layer where extension regions are to be formed (the source/drain regions 23 and regions of the semi-conductive layer where first extension regions 25A are to be formed in Example 3), by an ion-implanting method. For producing CMOS for example, a resist material (not shown) is formed on a region of the silicon semiconductor substrate 10 where a p-channel type semiconductor device is to be formed, and the silicon semiconductor substrate 10 is ion-implanted with arsenic (As) which is an n-type impurity (see FIG. 6B). Then, the resist material is removed, a resist material (not shown) is formed on a region of the silicon semiconductor substrate 10 where an n-channel type semiconductor device is to be formed, and the silicon semiconductor substrate 10 is ion-implanted with boron (B) which is a p-type impurity.

TABLE 12

| n-Channel type semiconductor device | |
|---|---|
| Ion species | As$^+$ |
| Acceleration energy | 10 keV |
| Dose | $1 \times 10^{15}/cm^2$ |
| p-Channel type semiconductor device | |
| Ion species | BF$_2^+$ |
| Acceleration energy | 10 keV |
| Dose | $6 \times 10^{14}/cm^2$ |

TABLE 13

| Treatment temperature | 1000° C. |
|---|---|
| Treatment time period | 10 seconds |
| Treatment atmosphere | N$_2$ gas atmosphere |

Figure 7A:
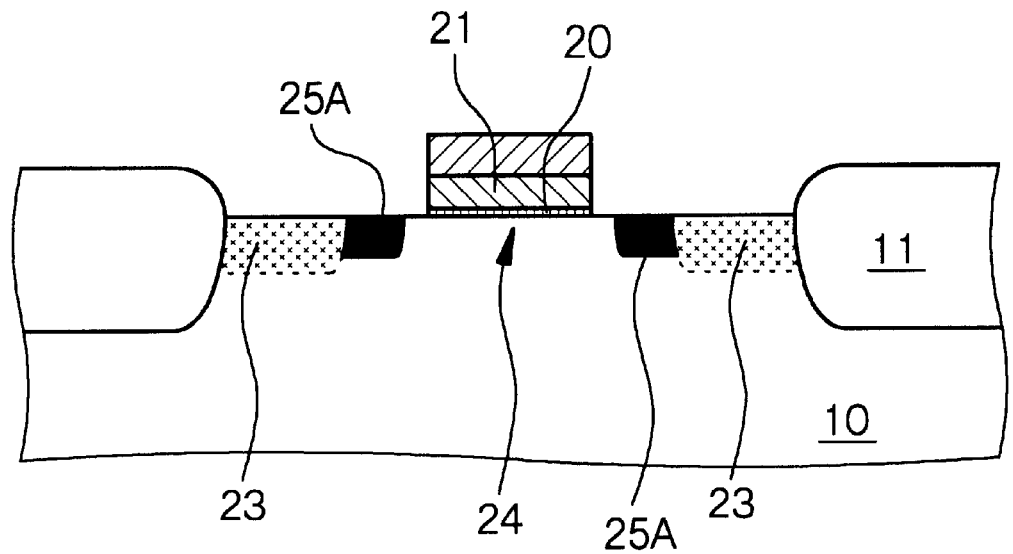
FIGS. 7A and 7B, following
Figure 7B:
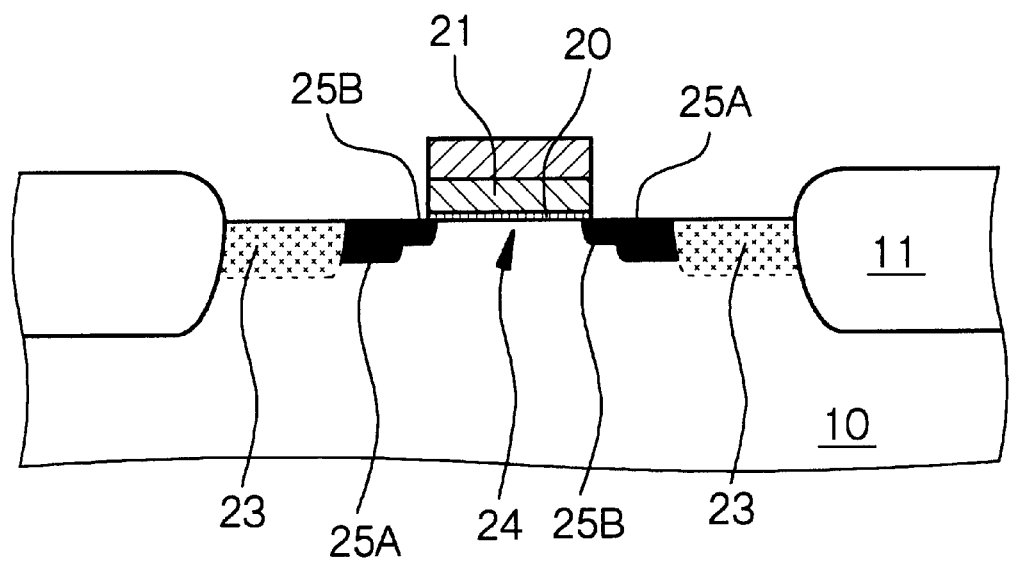

Then, the silicon oxide layer formed on the surface of the silicon semiconductor substrate 10 is removed with a hydrofluoric-acid-containing aqueous solution, and the first sidewall units 22A are removed by a plasma etching method (see FIG. 7A). For preventing channeling, preferably, an approximately 4 nm thick silicon oxide layer is again formed on the surface of the silicon semiconductor substrate 10 by a dry oxidation method. Then, an impurity is introduced into at least regions of the semi-conductive layer where extension regions are to be formed (the source/drain regions 23, the first extension regions 25A and regions of the semi-conductive layer where second extension regions 25B are to be formed in Example 3) by an ion-implanting method (see FIG. 7B). When CMOS is produced for example, the above procedure can be carried out. Table 14 shows conditions of the ion-implantation. Then, the introduced impurities are heat-treated for activation by an RTA method. Table 15 shows a condition of the heat treatment for activation.

TABLE 14

| n-Channel type semiconductor device | |
|---|---|
| Ion species | As$^+$ |
| Acceleration energy | 5 keV |
| Dose | $5 \times 10^{14}/cm^2$ |
| p-Channel semiconductor device | |
| Ion species | BF$_2^+$ |

TABLE 14-continued

| Acceleration energy | 5 keV |
|---|---|
| Dose | $3 \times 10^{14}/cm^2$ |

TABLE 15

| Treatment temperature | 950° C. |
|---|---|
| Treatment time period | 10 seconds |
| Treatment atmosphere | N$_2$ gas atmosphere |

[Step-340]

Then, [Step-140] in Example 1 is carried out, whereby a semiconductor device is completed.

In thus-obtained semiconductor device, each source/drain region 23 has an impurity concentration of approximately $3 \times 10^{20}/cm^3$ the first extension region 25A has an impurity concentration of approximately $1.3 \times 10^{20}/cm^3$ when the semiconductor device is an n-channel MOS type semiconductor device or an impurity concentration of approximately $8 \times 10^{19}/cm^3$ when the semiconductor device is a p-channel MOS type semiconductor device, and the second extension region 25B has an impurity concentration of approximately $8 \times 10^{19}/cm^3$ when the semiconductor device is an n-channel MOS type semiconductor device or an impurity concentration of approximately $5 \times 10^{19}/cm^3$ when the semiconductor device is a p-channel MOS type semiconductor device.

In Example 3, there may be employed a constitution in which the gate electrode 21 is formed of a polysilicon layer like Example 2 and the source/drain regions 23 are converted to silicide like Example 2.

The present invention has been explained with reference to Examples hereinabove, while the present invention shall not be limited thereto. Those various conditions, materials and semiconductor device structures in Examples are described for showing examples and may be altered as required. In Example, the sidewall has a two-layered structure, while the sidewall may have three- or more layered structure. When the sidewall is formed as a sidewall having an N multi-layered structure, a first, a second, . . . N-th extension regions are formed.

When a so-called LDD structure is formed, it is sufficient to introduce an impurity into at least regions of a semi-conductive layer where extension regions are to be formed (for example, the source/drain regions 23 and regions of the semi-conductive layer where the extension regions 25 are to be formed) by an ion-implanting method under conditions shown in Table 16. Then, the introduced impurities are heat-treated for activation by an RTA method. Table 17 shows a condition of the heat treatment for activation. When the extension regions 25 are formed under these conditions, each extension region has an impurity concentration of approximately $1 \times 10^{18}/cm^3$ when the semiconductor device is an n-channel MOS type semiconductor device or an impurity concentration of approximately $2 \times 10^{18}/cm^3$ when the semiconductor device is a p-channel MOS type semiconductor device.

TABLE 16

| n-Channel type semiconductor device | |
|---|---|
| Ion species | As$^+$ |
| Acceleration energy | 10 keV |
| Dose | $8 \times 10^{12}/cm^2$ |

TABLE 16-continued p-Channel semiconductor device

| | |
|---|---|
| Ion species | $BF_2^+$ |
| Acceleration energy | 10 keV |
| Dose | $1.6 \times 10^{13}/cm^2$ |

TABLE 17

| | |
|---|---|
| Treatment temperature | 1000° C. |
| Treatment time period | 10 seconds |
| Treatment atmosphere | $N_2$ gas atmosphere |

Figure 8:
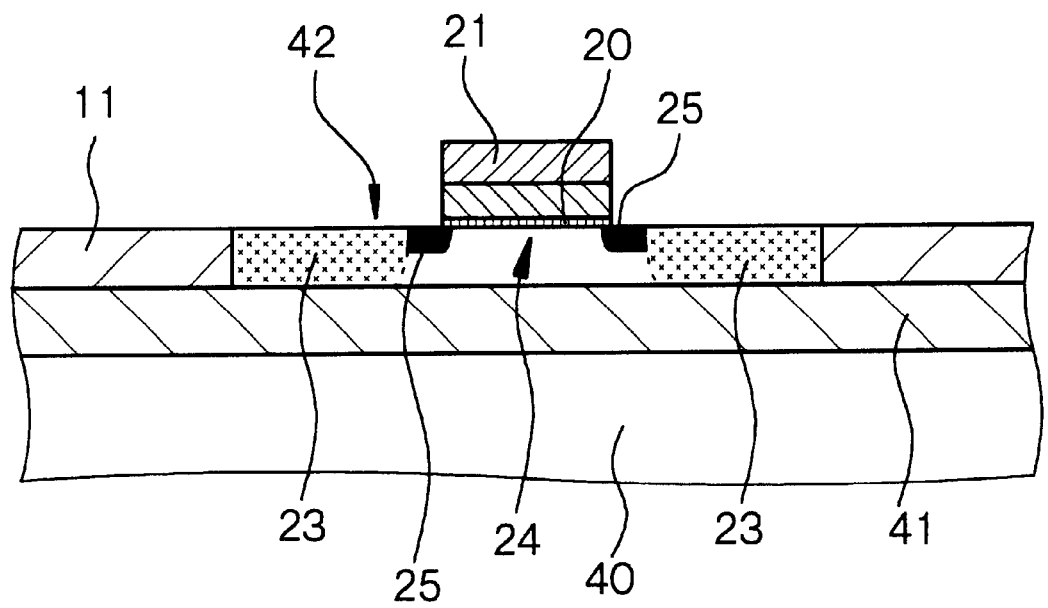
FIG. 8 is a schematic partial cross-sectional view of a semiconductor device obtained when the method for producing a semiconductor device, provided by the present invention, is applied to the production of an SOI type semiconductor device.
Figure 9A:
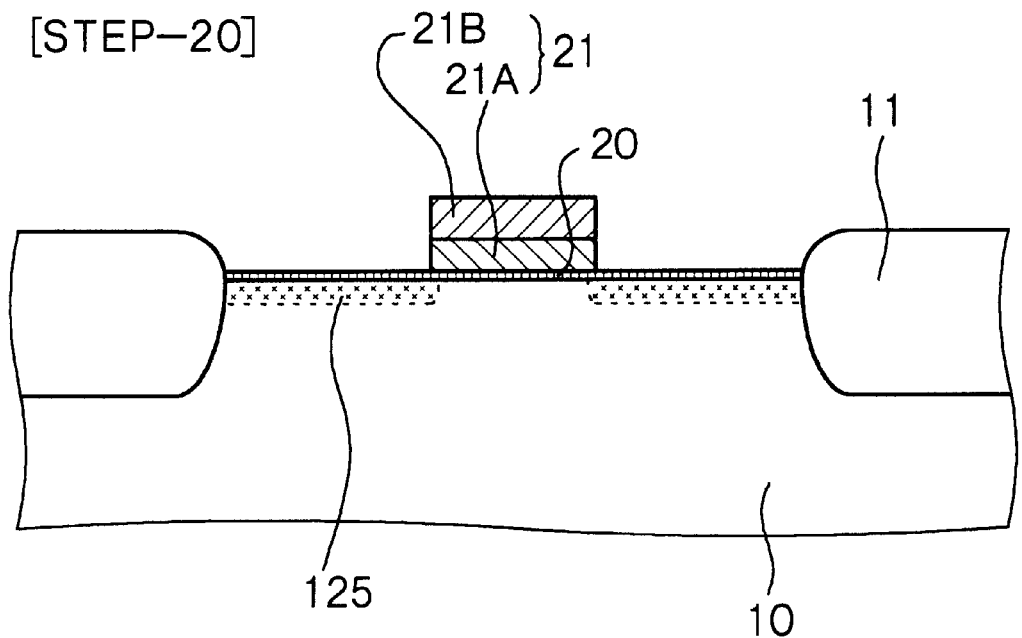
FIGS. 9A and 9B are schematic partial cross-sectional views of a semiconductor substrate, etc., for outlining a conventional method of forming an extension region.
Figure 9B:
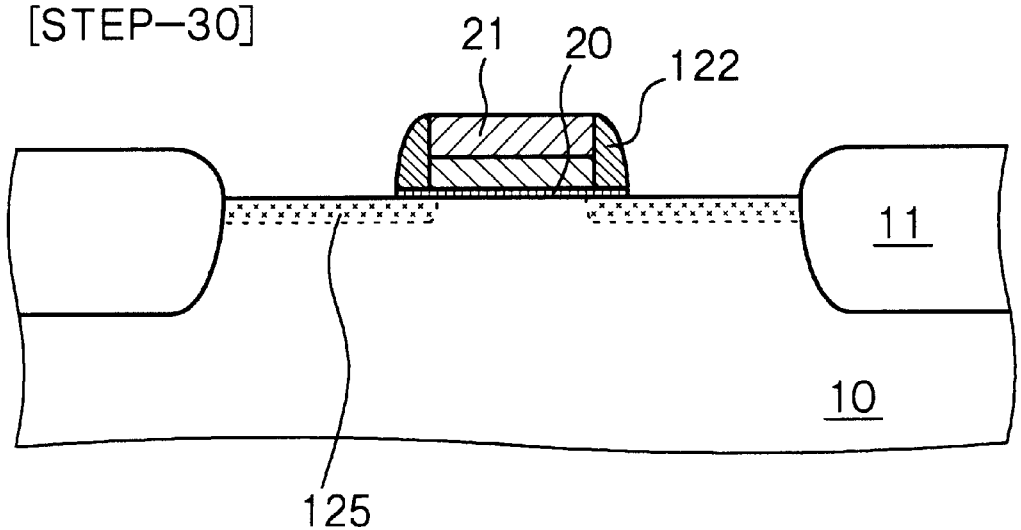
Figure 10:
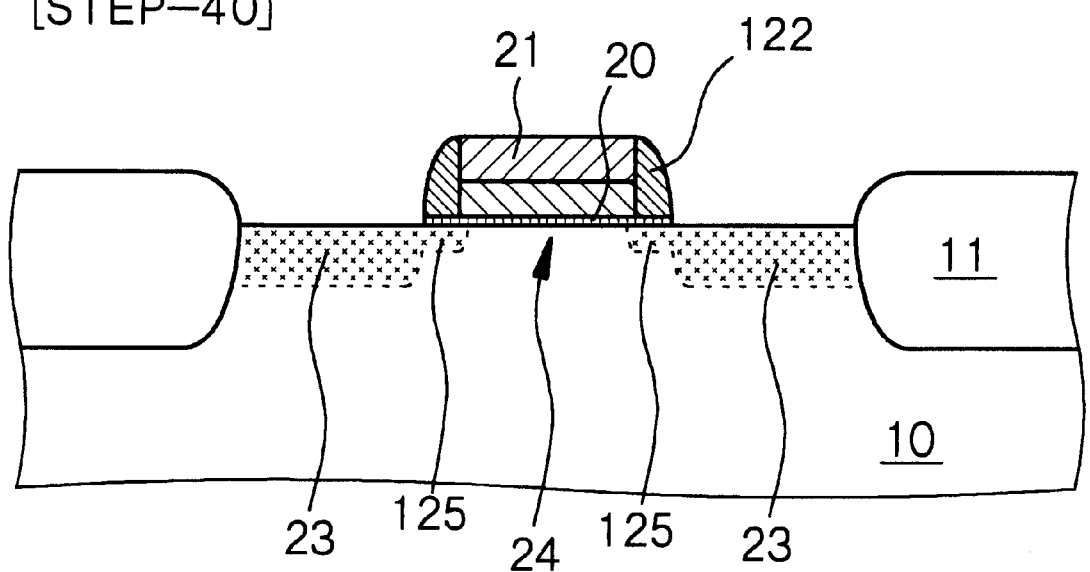
FIG. 10, following

The method for producing a semiconductor device, provided by the present invention, can be applied to the production of a so-called SOI type semiconductor device. FIG. 8 shows a schematic partial cross-sectional view of an obtained SOI type semiconductor device. This SOI type semiconductor device is formed in a semi-conductive layer 42 formed on an insulation layer 41 formed on a surface of a support made of a supporting substrate 40. Except for these points, the semiconductor device is substantially structurally the same as the semiconductor device explained in Example 1, and detailed explanations thereof are therefore omitted. Further, an SOI type semiconductor device can be also produced by applying the method explained in Example 2 or 3. When the SOI type semiconductor is produced, a metal for a metal layer used for converting source/drain regions into silicide is preferably selected from cobalt (Co), nickel (Ni) or platinum (Pt). The reason therefore is that when a layer of any one of these metals is used, metal atoms constituting the metal layer mainly migrate into the semi-conductive layer during the conversion into silicide. In the conversion to silicide, when the thickness of the semi-conductive layer is small (thickness on $10^{-5}$ m order), and when atoms constituting the semi-conductive layer mainly migrate into the metal layer, voids are generated in the semi-conductive layer in some cases.

A device isolation region in the SOI type semiconductor device can be formed by the following method.

(a) A so-called LOCOS method in which a pad oxide layer and a silicon nitride layer are formed on a semi-conductive layer, the silicon nitride layer and the pad oxide layer are patterned to form a mask for forming a device isolation region, and the semi-conductive layer is thermally oxidized with utilizing the mask for forming a device isolation region, to form a device isolation region.

(b) A so-called STI (Shallow Trench Isolation) method in which a semi-conductive layer is patterned to form a trench in the semi-conductive layer, and the trench is filled with an insulating material.

(c) A method of a combination of the substrate bonding method and the STI method, in which, when a SOI layer is prepared according the above method (1) or (2), a trench is formed in a semiconductor substrate and filled with an insulation layer, then, an interlayer (for example, an $SiO_2$ layer or a layer having a stacked structure formed of an $SiO_2$ layer and a polysilicon layer) is formed on the entire surface, the thus-prepared semiconductor substrate and a supporting substrate are bonded through the interlayer, and the semiconductor substrate is ground and polished from its back surface, to obtain a support made of the supporting substrate, the insulation layer and a semi-conductive layer made of the semiconductor substrate.

(d) A method of forming a Mesa type device isolation region, in which a semi-conductive layer on an insulation layer is removed to expose the insulation layer, whereby a device isolation region is formed.

In the method for producing a semiconductor device, provided by the present invention, since the number of times of the heat treatment for activation of the extension region is smaller than the counterpart of the heat treatment for activation of the source/drain region, the impurity concentration profile in the extension region can be highly accurately maintained. Further, since the thermal budget in the extension region can be determined independently of the determination of the thermal budget in the source/drain region, the impurity concentration profile in the extension region can be highly accurately controlled. As a result, the controllability of the impurity concentration profile in the extension region adjacent to the channel-forming region is improved, so that a parasitic resistance and a parasitic capacitance in the semiconductor device can be decreased, which leads to the production of a semiconductor device operable at a high speed with decreased power consumption.

What is claimed is:

1. A method for producing a semiconductor device having:

(a) a gate insulating layer formed on a surface of a semi-conductive layer, and a gate electrode formed on the gate insulating layer, the semi-conductive layer formed on an insulation layer formed on a support, (b) a channel-forming region formed in the semi-conductive layer immediately below the gate electrode, (c) source/drain regions formed in the semi-conductive layer, so as to sandwich the channel-forming region, and (d) extension regions, each of which is formed in a region of the semi-conductive layer positioned between each source/drain region and the channel-forming region and extends from each source/drain region, said method comprising the steps of:

(A) forming the gate insulating layer on the surface of the semi-conductive layer, and then, forming the gate electrode on the gate insulating layer, (B) introducing an impurity in regions of the semi-conductive layer where the source/drain regions are to be formed, and then, carrying out heat treatment for activation of the introduced impurity, to form the source/drain regions in the semi-conductive layer such that a junction depth of the source/drain regions is determined by a thickness of the semi-conductive layer, and (C) introducing an impurity into at least regions of the semi-conductive layer where the extension regions are to be formed, and then, carrying out heat treatment for activation of the introduced impurity, to form the extension regions in the semi-conductive layer.

2. The method according to claim 1, in which the gate electrode is formed of at least a polysilicon layer, and the step (C) includes the step of oxidizing side walls of the polysilicon layer constituting the gate electrode.

3. The method according to claim 1, in which:

between the steps (A) and (B), sidewalls are formed on the side walls of the gate electrode, in the step (B), the impurity is introduced into the regions of the semi-conductive layer where the source/drain regions are to be formed and the heat treatment for activation of the introduced impurity is carried out, and in the step (C), the sidewalls are removed, the impurity is introduced into the source/drain regions and the regions of the semi-conductive layer where the extension regions are to be formed and the heat treatment for activation of the introduced impurity is carried out.

4. The method according to claim 1, in which in the step (C), the formation of the extension region is carried out a plurality of times from a source/drain region side.

5. The method according to claim 4, in which:

between the steps (A) and (B), sidewalls having a multi-layered structure are formed on the side walls of the gate electrode, in the step (B), the impurity is introduced into the regions of the semi-conductive layer where the source/drain regions are to be formed and the heat treatment for activation of the introduced impurity is carried out, and in the step (C), of each sidewall having a multi-layered structure, each sidewall unit, constituting each sidewall having a multi-layered structure, positioned on the outer side is removed, the impurity is introduced into the source/drain regions and the regions of the semi-conductive layer where the extension regions are to be formed, then, the heat treatment for activation of the introduced impurity is carried out, and the removal of such a sidewall unit, the introduction of the impurity and the heat treatment for activation are repeated until the sidewall units constituting the sidewall having a multi-layered structure are all removed.

6. The method according to claim 1, in which gate-sidewalls are formed on the side walls of the gate electrode so as to cover at least the extension regions after the step (c), and then, the source/drain regions are converted to silicide source/drain regions.

7. The method according to claim 1, in which the semi-conductive layer is formed on an insulation layer formed on a support.

* * * * *